United States Patent
Kitagawa et al.

(10) Patent No.: US 10,619,894 B2
(45) Date of Patent: Apr. 14, 2020

(54) SUBSTRATE PROCESSING APPARATUS AND SUBSTRATE PROCESSING METHOD

(71) Applicant: SCREEN Holdings Co., Ltd., Kyoto (JP)

(72) Inventors: Hiroaki Kitagawa, Kyoto (JP); Dai Ueda, Kyoto (JP); Katsuhiko Miya, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 36 days.

(21) Appl. No.: 15/393,698

(22) Filed: Dec. 29, 2016

(65) Prior Publication Data

US 2017/0213725 A1    Jul. 27, 2017

(30) Foreign Application Priority Data

Jan. 26, 2016  (JP) .................. 2016-012545

(51) Int. Cl.
*B08B 7/00* (2006.01)
*F25B 21/02* (2006.01)
(Continued)

(52) U.S. Cl.
CPC ............ *F25B 21/02* (2013.01); *B08B 7/0014* (2013.01); *H01L 21/02052* (2013.01);
(Continued)

(58) Field of Classification Search
CPC ... B08B 7/0014; B05D 3/10; H01L 21/02502; H01L 21/67051; H01L 21/67109; H01L 21/68764; F25B 21/02
(Continued)

(56) References Cited

U.S. PATENT DOCUMENTS 5,580,607 A * 12/1996 Takekuma .............. B05C 11/08
                                                    118/52
6,322,626 B1    11/2001 Shirley ......................... 118/73
(Continued)

FOREIGN PATENT DOCUMENTS

CN      104517871 A      4/2015
JP      2000-323471 A    11/2000
(Continued)

OTHER PUBLICATIONS

Notice of Allowance dated Apr. 11, 2018 in corresponding Korean Patent Application No. 10-2017-0006150.
(Continued)

*Primary Examiner* — Kirsten Jolley
(74) *Attorney, Agent, or Firm* — Ostrolenk Faber LLP

(57) ABSTRACT

A substrate processing apparatus comprises: a first solidifier and a second solidifier. The first solidifier solidifies a liquid to be solidified adhering to a front surface of a substrate by supplying a liquid refrigerant to a back surface of the substrate at a first position. The second solidifier solidifies the liquid to be solidified by at least one of a first cooling mechanism and a second cooling mechanism. The first cooling mechanism cools the liquid to be solidified by supplying a gas refrigerant toward the substrate at a second position more distant from a center of rotation of the substrate in a radial direction than the first position. The second cooling mechanism cools the liquid to be solidified by bringing a processing surface into contact with the liquid to be solidified at the second position.

4 Claims, 8 Drawing Sheets

(51) Int. Cl.
   *H01L 21/67*     (2006.01)
   *H01L 21/687*    (2006.01)
   *H01L 21/02*     (2006.01)
   *B05D 3/10*      (2006.01)

(52) U.S. Cl.
   CPC .. *H01L 21/67051* (2013.01); *H01L 21/67109* (2013.01); *H01L 21/68764* (2013.01); *B05D 3/10* (2013.01)

(58) Field of Classification Search
   USPC ............ 118/69; 134/4, 105, 149, 153, 902; 427/240
   See application file for complete search history.

(56) References Cited

U.S. PATENT DOCUMENTS

| | | | |
|---|---|---|---|
| 6,548,111 B1* | 4/2003 | Shirley | H01L 21/67109 118/320 |
| 8,623,146 B2 | 1/2014 | Kato et al. | 134/4 |
| 9,214,331 B2 | 12/2015 | Miya et al. | 134/4 |
| 2001/0041229 A1 | 11/2001 | Sakamoto et al. | 427/555 |
| 2010/0313915 A1 | 12/2010 | Fujiwara et al. | 134/33 |
| 2012/0175819 A1* | 7/2012 | Miya | H01L 21/02052 264/334 |
| 2012/0186275 A1* | 7/2012 | Kato | H01L 21/02052 62/64 |
| 2014/0144465 A1 | 5/2014 | Kaneko et al. | 134/4 |
| 2015/0090302 A1 | 4/2015 | Fujiwara et al. | 134/26 |
| 2015/0128994 A1 | 5/2015 | Kaneko et al. | |
| 2015/0128995 A1 | 5/2015 | Kaneko et al. | |
| 2015/0200086 A1 | 7/2015 | Yokoyama | |
| 2016/0035564 A1 | 2/2016 | Aibara et al. | |
| 2016/0059274 A1 | 3/2016 | Miya et al. | |

FOREIGN PATENT DOCUMENTS

| | | |
|---|---|---|
| JP | 2008-028008 A | 2/2008 |
| JP | 2009-021409 A | 1/2009 |
| JP | 2010-80584 A | 4/2010 |
| JP | 2011-198894 A | 10/2011 |
| JP | 2013-074232 A | 4/2013 |
| JP | 2013-206983 A | 10/2013 |
| JP | 2014-011426 A | 1/2014 |
| JP | 2015-062259 A | 4/2015 |
| JP | 5701068 B2 | 4/2015 |
| JP | 5715831 B2 | 5/2015 |
| JP | 5715837 B2 | 5/2015 |
| JP | 2015-119164 A | 6/2015 |
| JP | 2015-133444 A | 7/2015 |
| JP | 2015-228395 A | 12/2015 |
| JP | 2016-034006 A | 3/2016 |
| JP | 5977727 B2 | 8/2016 |
| KR | 10-2013-0007151 A | 1/2013 |
| KR | 10-2015-0032771 | 3/2015 |

OTHER PUBLICATIONS

Office Action dated Aug. 17, 2017 issued in corresponding Korean Patent Application No. 10-2017-0006150.
Office Action dated Jul. 29, 2019 in corresponding Chinese Patent Application No. 201710059990.X.
Office Action dated Aug. 6, 2019 in corresponding Japanese Patent Application No. JP 2016-012545.

* cited by examiner

SUBSTRATE PROCESSING APPARATUS AND SUBSTRATE PROCESSING METHOD

CROSS REFERENCE TO RELATED APPLICATION

The disclosure of Japanese Patent Application enumerated below including specification, drawings and claims is incorporated herein by reference in its entirety: No. 2016-12545 filed on Jan. 26, 2016.

BACKGROUND OF THE INVENTION

1. Field of the Invention

The invention relates to a solidification technique for solidifying a liquid to be solidified adhering to surfaces of various substrates such as semiconductor substrates, glass substrates for photo mask, glass substrates for liquid crystal display, glass substrates for plasma display, substrates for FED (Field Emission Display), substrates for optical disc, substrates for magnetic disc and substrates for opto-magnetic disc (hereinafter, merely written as "substrates") and a substrate processing apparatus and a substrate processing method for cleaning a surface of a substrate using the solidification technique.

2. Description of the Related Art

A manufacturing process of an electronic component such as a semiconductor device or a liquid crystal display device includes a step of forming a fine pattern by repeatedly applying processes such as film formation on a surface of a substrate and etching. Here, the surface of the substrate needs to be kept in a clean state to satisfactorily perform fine processing and a cleaning process is performed on the surface of the substrate if necessary. For example, in an apparatus described in JP2008-28008A, a liquid such as deionized water (hereinafter, written as "DIW") is supplied to a surface of a substrate and, after the liquid is frozen, the frozen liquid is thawed and removed with a rinsing liquid, whereby the surface of the substrate is cleaned.

Specifically, in the apparatus described in JP2008-28008A, the following steps are performed. First, a substrate is arranged in a horizontal posture with a surface faced up and a DIW liquid film is formed on the entire surface of the substrate by supplying DIW to the surface (upper surface) of the substrate. Subsequently, the supply of the DIW is stopped and the substrate is rotated while a liquid refrigerant is supplied to a central part of the underside of the substrate, whereby the liquid refrigerant is uniformly spread over the entire underside of the substrate. In this way, the entire substrate is directly cooled by the liquid refrigerant in contact with the underside of the substrate and the liquid film formed on the surface of the substrate is frozen. At this time, the DIW having intruded into between contaminants such as particles and the surface of the substrate becomes ice and expands, whereby the contaminants such as particles are moved away from the substrate by a minute distance. Further, the iced DIW also expands in a direction parallel to the surface of the substrate, whereby particles and the like adhering to the substrate are exfoliated. As a result, adhesion between the surface of the substrate and the contaminants such as particles is reduced and, further, the contaminants such as particles are separated from the surface of the substrate. Thereafter, by thawing and removing the ice present on the surface of the substrate with the DIW as the rinsing liquid, the contaminants such as particles can be efficiently removed from the surface of the substrate.

SUMMARY OF THE INVENTION

However, in the above conventional technique, the substrate is rotated at such a rotational frequency as to be able to prevent the liquid refrigerant from flowing around to the surface when the liquid refrigerant is supplied to the underside of the substrate. Thus, the liquid refrigerant does not spread to a peripheral edge part of the substrate and the liquid film located on the peripheral edge part of the substrate on the surface of the substrate cannot be solidified in a short time. This is one of main causes of a throughput reduction of a substrate processing.

The invention was developed in view of the above problem and aims to provide a technique for efficiently forming a solidified body on a surface of a substrate in a short time.

According to a first aspect of the disclosure, there is provided a substrate processing apparatus. The apparatus comprises: a substrate holder that holds a substrate in a horizontal posture with a front surface having a liquid to be solidified adhering thereto faced up; a rotator that rotates the substrate held by the substrate holder about a vertical axis; a first solidifier that solidifies the liquid to be solidified by supplying a liquid refrigerant having a temperature lower than a solidification point of the liquid to be solidified to a back surface of the substrate at a first position; and a second solidifier that solidifies the liquid to be solidified by at least one of a first cooling mechanism and a second cooling mechanism, the first cooling mechanism cooling the liquid to be solidified by supplying a gas refrigerant having a temperature lower than the solidification point of the liquid to be solidified toward the substrate at a second position more distant from a center of rotation of the substrate in a radial direction than the first position, the second cooling mechanism cooling the liquid to be solidified by bringing a processing surface having a temperature lower than the solidification point of the liquid to be solidified into contact with the liquid to be solidified at the second position, wherein the liquid to be solidified is solidified by the first and second solidifiers in parallel with the rotation of the substrate by the rotator.

According to a second aspect of the disclosure, there is provided a substrate processing method. The method comprises: a rotating step of rotating a substrate in a horizontal posture with a front surface having a liquid to be solidified adhering thereto faced up about a vertical axis; a first solidifying step of solidifying the liquid to be solidified by supplying a liquid refrigerant having a temperature lower than a solidification point of the liquid to be solidified to an back surface of the substrate at a first position; and a second solidifying step of solidifying the liquid to be solidified by performing at least one of a supplying step and a bringing step, the supplying step being of supplying a gas refrigerant having a temperature lower than the solidification point of the liquid to be solidified toward the substrate at a second position more distant from a center of rotation of the substrate in a radial direction than the first position, the bringing step being of bringing a contact member having a processing surface having a temperature lower than the solidification point of the liquid to be solidified into contact with the liquid to be solidified at the second position, wherein the first and second solidifying steps are performed during the rotating step.

As described above, according to the invention, the solidification of the liquid to be solidified and the rotation of the substrate are performed in parallel at two positions at mutually different distances from the center of rotation of the substrate, i.e. at the first and second positions. More specifically, the liquid to be solidified is solidified by the supply of the liquid refrigerant to the underside of the substrate around the first position close to the center of rotation of the substrate and the liquid to be solidified is solidified by the supply of the gas refrigerant and the contact of the processing surface having a low temperature with the liquid around the second position distant from the center of rotation of the substrate. Since the liquid to be solidified is solidified at the two positions different from each other, a solidified body can be efficiently formed on the surface of the substrate in a short time.

DETAILED DESCRIPTION OF THE PREFERRED EMBODIMENTS

Figure 1:
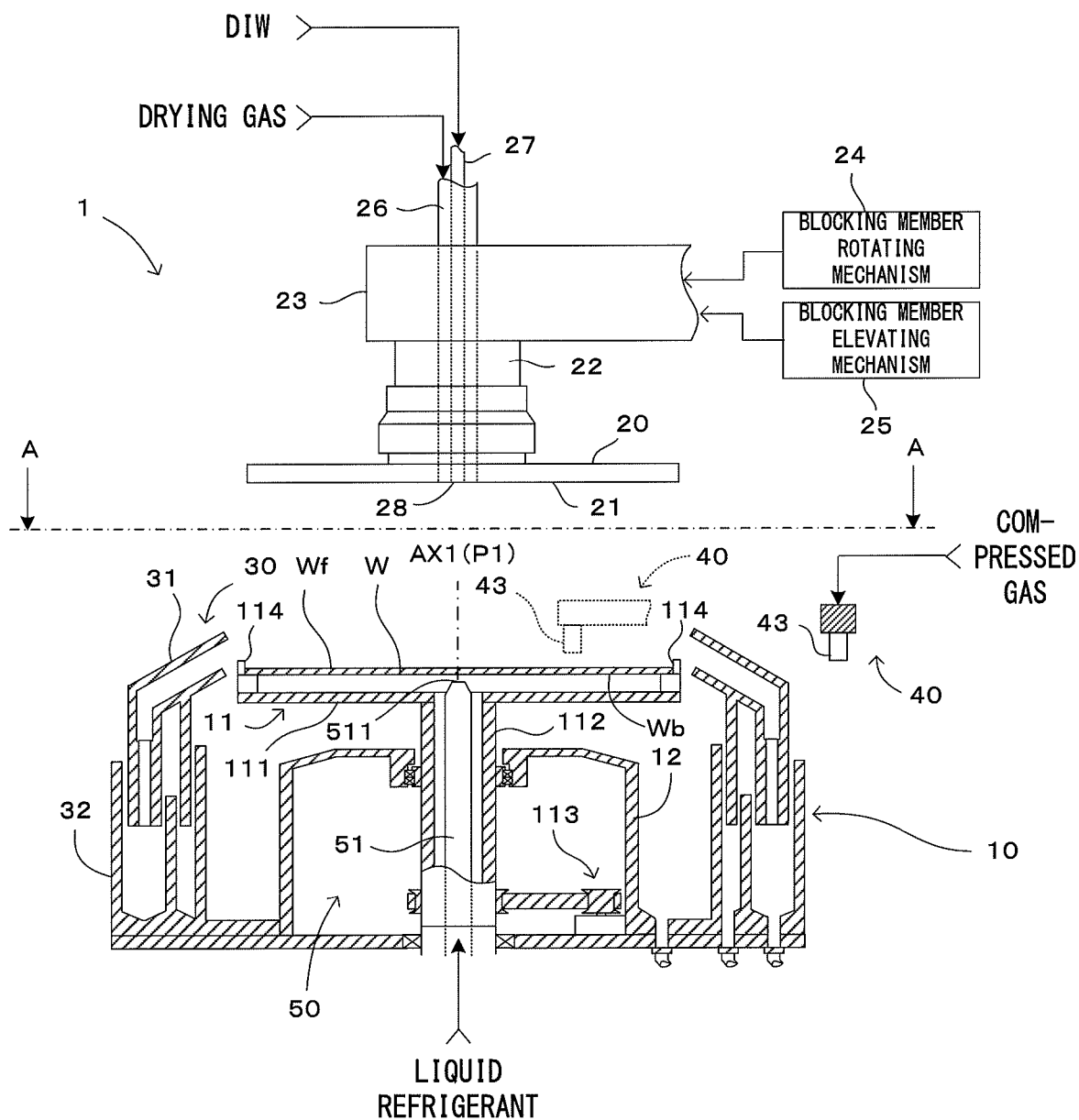
FIG. 1 is a diagram showing one embodiment of a substrate processing apparatus according to the invention.
Figure 2:
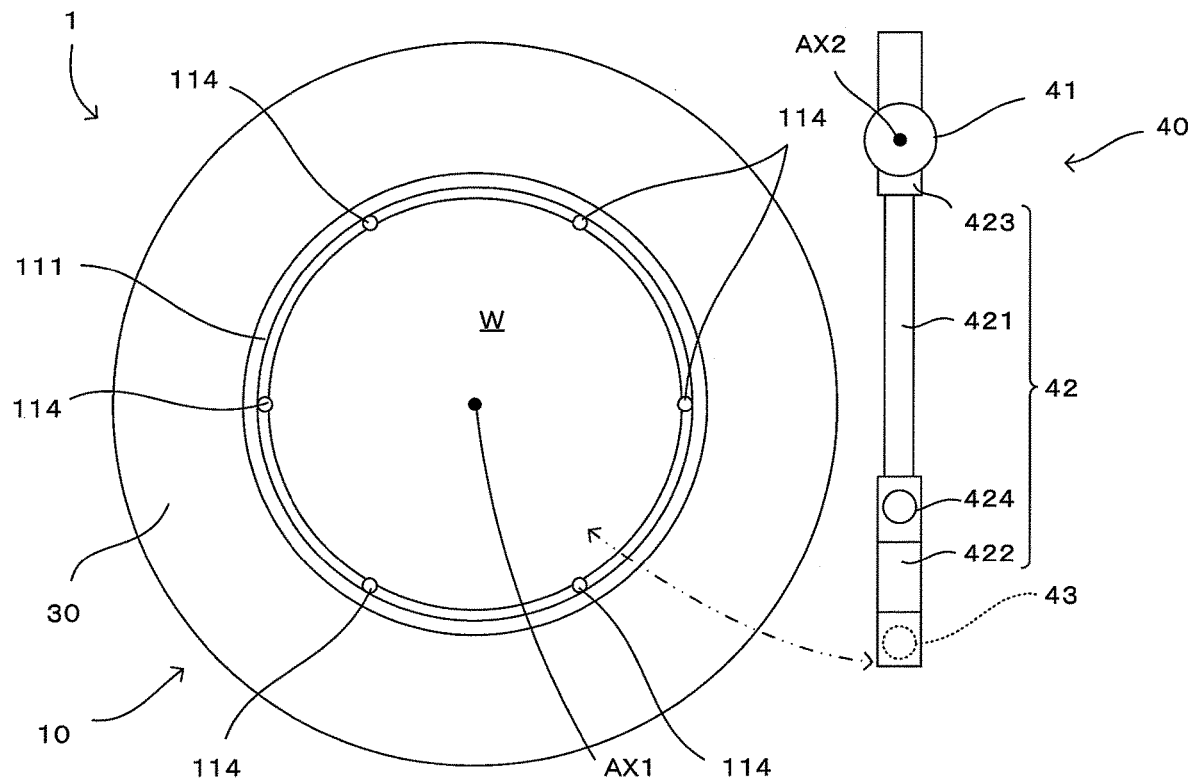
FIG. 2 is a plan view taken along a line indicated by arrows A-A in FIG. 1.
Figure 3:
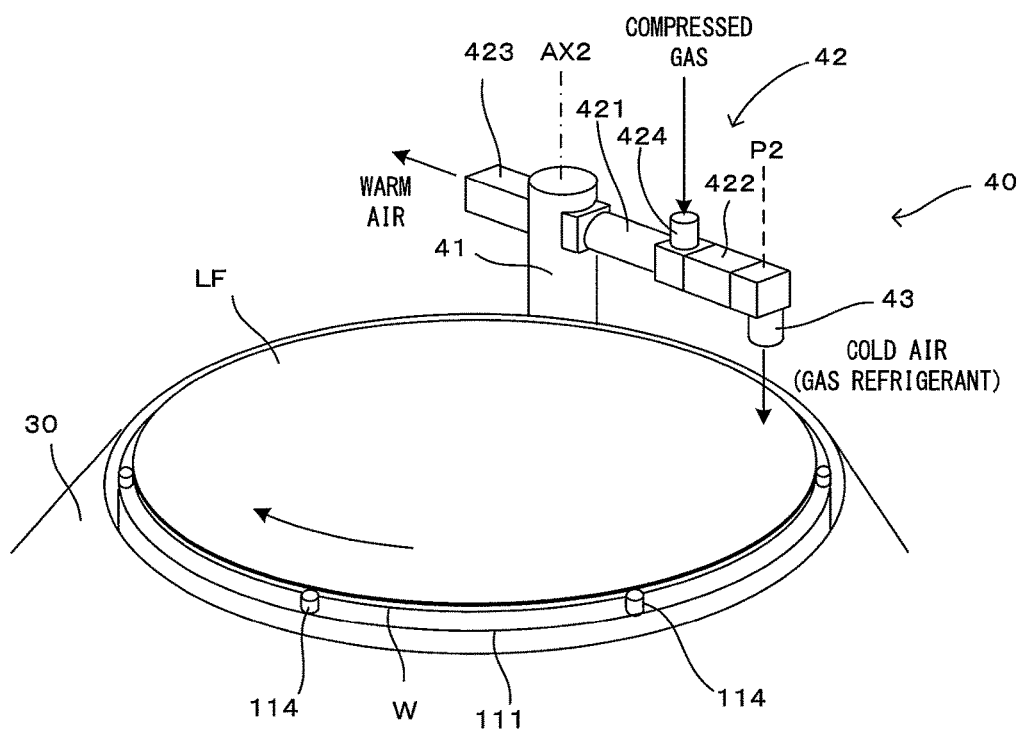
FIG. 3 is a partial enlarged perspective view of the substrate processing apparatus shown in FIG. 1.
Figure 4:
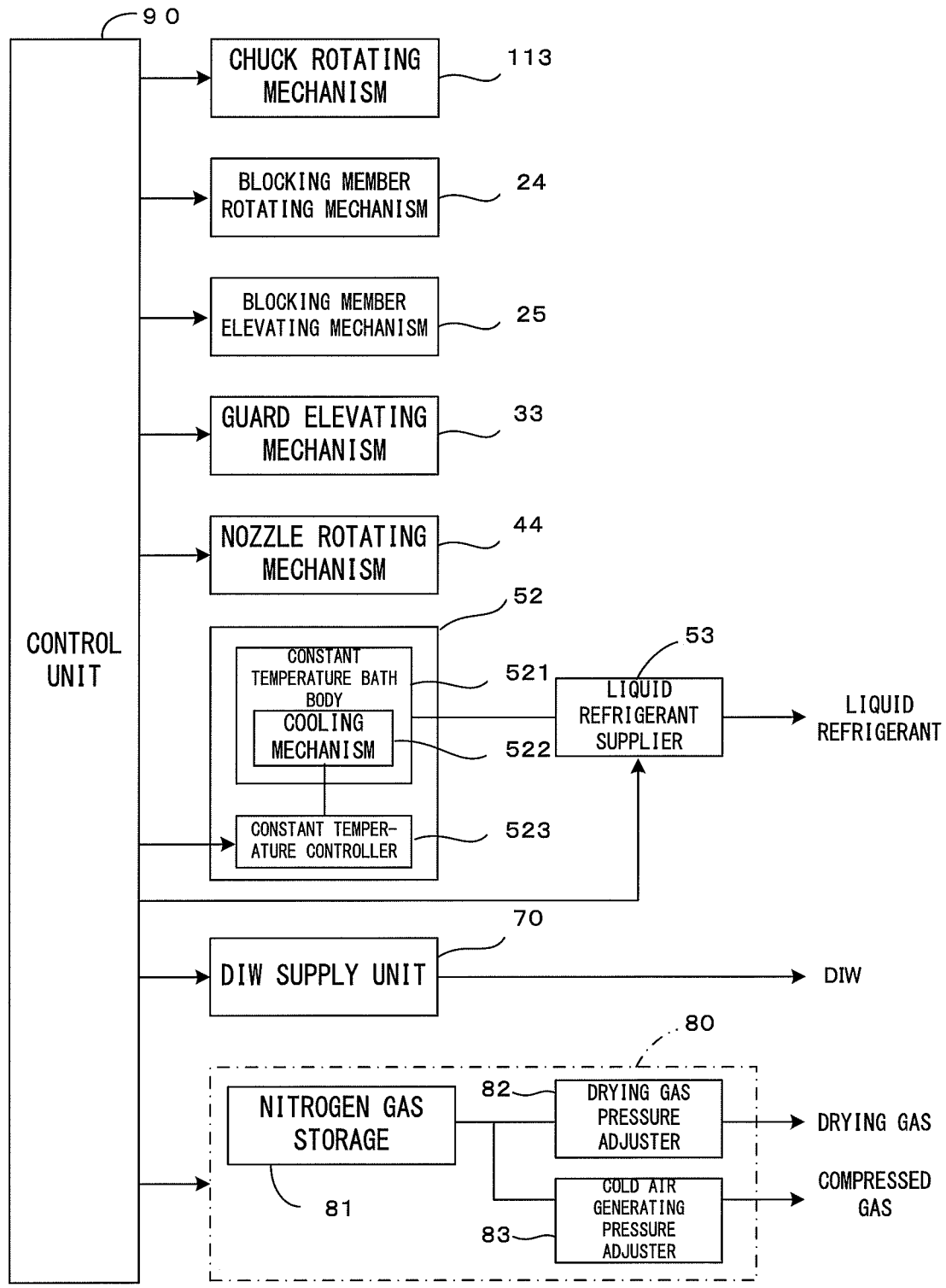
FIG. 4 is a block diagram showing a center solidifier, a peripheral edge solidifier and a control configuration of the substrate processing apparatus shown in FIG. 1.

FIG. 1 is a diagram showing one embodiment of a substrate processing apparatus according to the invention. FIG. 2 is a plan view taken along a line indicated by arrows A-A in FIG. 1. FIG. 3 is a partial enlarged perspective view of the substrate processing apparatus shown in FIG. 1. FIG. 4 is a block diagram showing a center solidifier, a peripheral edge solidifier and a control configuration of the substrate processing apparatus shown in FIG. 1. The substrate processing apparatus is a single substrate processing apparatus capable of performing a substrate cleaning process for removing contaminants such as particles adhering to a front surface Wf of a substrate W such as a semiconductor wafer.

A substrate processing apparatus 1 is provided with a processing chamber (not shown) having a processing space for applying the cleaning process to the substrate W inside, and a substrate holder 10 is provided in the processing chamber. As shown in FIG. 1, the substrate holder 10 is for holding the substrate W substantially in a horizontal posture with the front surface Wf of the substrate W faced up and rotating the substrate W. The substrate holder 10 includes a spin chuck 11 in which a disc-shaped spin base 111 having a slightly larger outer diameter than the substrate W and a rotation support shaft 112 extending substantially in a vertical direction are integrally connected. The rotation support shaft 112 is coupled to a rotary shaft of a chuck rotating mechanism 113 including a motor, and the spin chuck 11 is rotatable about an axis of rotation (vertical axis) AX1. These rotation support shaft 112 and chuck rotating mechanism 113 are housed in a hollow cylindrical casing 12. Further, the spin base 111 is integrally coupled to an upper end part of the rotation support shaft 112 by a fastening part such as a screw and the spin base 111 is supported substantially in a horizontal posture by the rotation support shaft 112. Thus, the chuck rotating mechanism 113 operates in response to a rotation command from a control unit 90 for controlling the entire apparatus, whereby the spin base 111 rotates about the vertical axis AX1. Note that the control unit 90 can adjust a rotational speed of the spin base 111 by controlling the chuck rotating mechanism 113.

A plurality of chuck pins 114 for gripping a peripheral edge part of the substrate W stand near a peripheral edge part of the spin base 111. It is sufficient to provide three or more chuck pins 114 (six in the example) to reliably hold the circular substrate W. As shown in FIG. 2, the chuck pins 114 are arranged at equal angular intervals along the peripheral edge part of the spin base 111.

Each of the chuck pins 114 is configured to be switchable between a pressing state where the chuck pin 114 presses the outer peripheral end surface of the substrate W and a releasing state where the chuck pin 114 is separated from the outer peripheral end surface of the substrate W. Each of the plurality of chuck pins 114 is set in the releasing state in transferring the substrate W to the spin base 111 while being set in the pressing state in rotating the substrate W and performing a predetermined process. By being set in the pressing state in this way, the plurality of chuck pins 114 can grip the peripheral edge part of the substrate W and hold the substrate W substantially in a horizontal posture above and at a predetermined distance from the spin base 111. In this way, the substrate W is supported with the front surface Wf thereof faced up and a back surface Wb thereof faced down. Note that a known configuration, e.g. the one described in JP2013-206983A, can be used as the chuck pins 14.

A disc-shaped blocking member 20 having an opening in a central part is provided above the spin chuck 11. The lower surface (bottom surface) of the blocking member 20 serves as a substrate facing surface 21 facing substantially in parallel to the front surface Wf of the substrate W held by the chuck pins 114, and a planar size thereof is set to have a diameter not shorter than that of the substrate W. The blocking member 20 is substantially horizontally mounted on a lower end part of a support shaft 22 having a substantially hollow cylindrical shape, and the support shaft 22 is held rotatably about the axis of rotation AX1 of the substrate W by an arm 23 extending in a horizontal direction. Further, a blocking member rotating mechanism 24 and a blocking member elevating mechanism 25 are connected to the arm 23.

The blocking member rotating mechanism 24 rotates the support shaft 22 about the axis of rotation AX1 of the substrate W in response to an operation command from the control unit 90. Further, the blocking member rotating mechanism 24 is configured to rotate the blocking member 20 substantially in the same rotating direction and at the same rotational speed as the substrate W according to the rotation of the substrate W held on the spin chuck 11.

Further, the blocking member elevating mechanism 25 can cause the blocking member 20 to proximately face the spin base 111 and, conversely, separate the blocking member 20 from the spin base 111 in response to an operation command from the control unit 90. Specifically, the control unit 90 causes the blocking member 20 to be raised to a separated position (position shown in FIG. 1) above the spin chuck 11 in carrying in and out the substrate W into and from the substrate processing apparatus 1 and solidifying a liquid film by actuating the blocking member elevating mechanism 25. On the other hand, the control unit 90 causes the blocking member 20 to be lowered to a facing position set very close to the front surface Wf of the substrate W held on the spin chuck 11 in applying a predetermined process (liquid film forming process, thawing/rinsing process, spin-drying process) to the substrate W.

The support shaft 22 is shaped to be hollow and has a gas supply pipe 26 inserted inside and a liquid supply pipe 27 is inserted inside the gas supply pipe 26. One end of each of the gas supply pipe 26 and the liquid supply pipe 27 extends to an opening of the blocking member 20 and communicates with the opening. Further, a nozzle 28 is provided on the one end of the liquid supply pipe 27. A double-pipe structure is formed by the gas supply pipe 26 and the liquid supply pipe 27 in this way, a clearance between the inner wall surface of the gas supply pipe 26 and the outer wall surface of the liquid supply pipe 27 functions as a gas supply path leading to the above opening, and the interior of the liquid supply pipe 27 functions as a liquid supply path leading to the nozzle 28. A gas supply unit 80 (FIG. 4) is connected to the gas supply path, and nitrogen gas supplied form the gas supply unit 80 is supplied as drying gas. More specifically, as shown in FIG. 4, the nitrogen gas fed under pressure from a nitrogen gas storage 81 is depressurized to a pressure suitable for a spin-drying process by a drying gas pressure adjuster 82 and supplied as the drying gas at a timing corresponding to a supply command from the control unit 90 by the drying gas pressure adjuster 82. Further, the other end of the liquid supply pipe 27 is connected to a DIW supply unit 70. Thus, if the DIW supply unit 70 feeds DIW under pressure in response to a DIW supply command from the control unit 90 with the blocking member 20 lowered to the facing position (see field (a) of FIG. 6), the DIW is supplied to the front surface Wf of the substrate W via the liquid supply pipe 27 and the nozzle 28 to form a liquid film LF (FIG. 3).

To collect the DIW supplied to the substrate W in this way, a splash guard 30 is provided around the casing 12. The splash guard 30 is arranged to surround around the substrate W held in the horizontal posture on the spin chuck 11. Further, the splash guard 30 is provided movably upward and downward along the axis of rotation AX1 of the spin chuck 11. The splash guard 30 is rotationally symmetrically shaped with respect to the axis of rotation AX1 and includes guards 31 in a plurality of stages (two stages in the example) respectively arranged concentrically with the spin chuck 11 for receiving the DIW scattered from the substrate W and a liquid receiver 32 for receiving the DIW flowing down from the guards 31. A guard elevating mechanism 33 raises and lowers the guards 31 in a stepwise manner in response to an elevation command from the control unit 90, whereby liquid components (DIW and liquid refrigerant to be described later) scattered from the rotating substrate W can be sorted and collected.

A peripheral edge solidifier 40 for solidifying the liquid film LF formed of the DIW adhering to the front surface Wf by supplying a gas refrigerant toward the peripheral edge part of the front surface Wf of the substrate W is provided around the splash guard 30. As shown in FIGS. 2 and 3, the peripheral edge solidifier 40 includes a rotary shaft 41 configured to be rotatable about vertical axis (axis of rotation) AX2, a vortex tube 42 held substantially in a horizontal posture by the rotary shaft 41, a cold air discharge nozzle 43 for discharging cold air blown out from a cold air blowout part of the vortex tube 42 as a gas refrigerant to the front surface Wf of the substrate W, and a nozzle rotating mechanism 44 (FIG. 4) for rotating the rotary shaft 41 in response to a rotation command from the control unit 90. In the embodiment, the nozzle rotating mechanism 44 drives and rotates the rotary shaft 41 in response to a rotation command from the control unit 90, whereby the vortex tube 42 swings about the vertical axis AX2, whereby the cold air discharge nozzle 43 reciprocally moves between a retracted position outside the splash guard 30 (position shown in solid line in FIG. 2) and a position where the cold air discharge nozzle 43 faces the peripheral edge part of the substrate W (corresponding to a "second position" of the invention) P2 (FIG. 3) as shown in chain double-dashed line in FIG. 2.

The vortex tube 42 is a device for generating cold air and warm air, utilizing a vortex effect, as conventionally known. As shown in FIG. 3, the vortex tube 42 includes a substantially tube-like housing 421, and a cold air blowout part 422 and a warm air blowout part 423 are provided on both end parts. Further, a compressed gas supplier 424 is formed on a side surface of the housing 421. The gas supply unit 80 (FIG. 4) is connected to the compressed gas supplier 424, and the nitrogen gas supplied from the gas supply unit 80 is supplied to the compressed gas supplier 424. More specifically, as shown in FIG. 4, the nitrogen gas fed under pressure from the nitrogen gas storage 81 is depressurized to a pressure suitable for generating cold air by a cold air generating pressure adjuster 83 and supplied as the compressed gas into the housing 421 at a timing corresponding to a supply command from the control unit 90 by the cold air generating pressure adjuster 83. Then, the supplied compressed gas generates a swirling flow along the inner wall surface of the housing 421 and flows toward the warm air blowout part 423.

The warm air blowout part 423 is provided with a valve (not shown), and warm air is blown out from an opening (not shown) of the warm air blowout part 423 according to an opening/closing amount of the valve, but the remaining gas is returned into the housing 421. The returned gas flows to the cold air blowout part 422 via the inside of the gas flowing in a swirling manner along the inner wall surface of the housing 421, i.e. a radial central part of the housing 421. The gas is cooled by the transfer of thermal energy to the gas flowing while generating a swirling flow along the inner wall surface of the housing 421 before reaching the cold air blowout part 422, and fed to the cold air discharge nozzle 43 via the cold air blowout part 422. As a result, the cold air reduced to a temperature (e.g. about −20 to −30° C.) lower than a solidification point of DIW is supplied as the gas refrigerant from the cold air discharge nozzle 43 to the peripheral edge part of the front surface Wf of the substrate W and the liquid film LF is cooled and solidified at the position P2.

Further, in the embodiment, a center solidifier 50 is provided, besides the peripheral edge solidifier 40, as a means for solidifying the liquid film LF. The center solidifier 50 solidifies the liquid film LF by supplying the liquid refrigerant to a central part of the back surface Wb of the substrate W. More specifically, as shown in FIGS. 1 and 4, the center solidifier 50 includes a liquid refrigerant supply pipe 51, a liquid refrigerant generating unit 52 for generating the liquid refrigerant, and a liquid refrigerant supplier 53 for supplying the liquid refrigerant to the back surface Wb of the substrate W by feeding the liquid refrigerant generated by the liquid refrigerant generating unit 52 under pressure to the liquid refrigerant supply pipe 51. The liquid refrigerant supply pipe 51 is arranged inside the rotation support shaft 112 with a nozzle part 511 on the tip faced toward the back surface Wb of the substrate W. The liquid refrigerant generating unit 52 is connected to a rear end part of the liquid refrigerant supply pipe 51 via the liquid refrigerant supplier 53.

The liquid refrigerant generating unit 52 includes a constant temperature bath body 521 for storing a liquid suitable as the liquid refrigerant inside, a cooling mechanism 522 provided in the constant temperature bath body 521 for cooling the liquid stored in the constant temperature bath body 521, and a constant temperature controller 523 for keeping the liquid stored in the constant temperature bath body 521 at a temperature (e.g. −50° C.) lower than the solidification point of the DIW by controlling energization to the cooling mechanism 522 in response to a temperature command from the control unit 90.

When the liquid refrigerant supplier 53 feeds the liquid refrigerant from the constant temperature bath body 521 of the liquid refrigerant generating unit 52 to the liquid refrigerant supply pipe 51 in response to a liquid refrigerant supply command from the control unit 90, the liquid refrigerant is supplied to a position P1, which is a central part of the back surface Wb of the substrate W, and the liquid film LF on the front surface Wf of the substrate W is cooled and solidified by the liquid refrigerant via the substrate W. Note that ethylene glycol aqueous solution, alcohols or HFE solution can be used as the "liquid refrigerant". Ethyl alcohol, methyl alcohol or isopropyl alcohol can be used as the alcohol in terms of handling, price and the like. Particularly, ethyl alcohol is preferable. Further, the "HFE solution" means solution mainly containing hydrofluoroether. For example, HFE of Novec (registered trademark) series produced by 3M Japan Limited can be used.

As just described, in the embodiment, two types of solidifiers, i.e. the peripheral edge solidifier 40 and the center solidifier 50 are provided and, as described below, the liquid film LF is solidified by the peripheral edge solidifier 40 and the center solidifier 50 while the substrate W is rotated. A substrate processing by the substrate processing apparatus 1 shown in FIG. 1 is described in detail below with reference to FIGS. 5 and 6.

Figure 5:
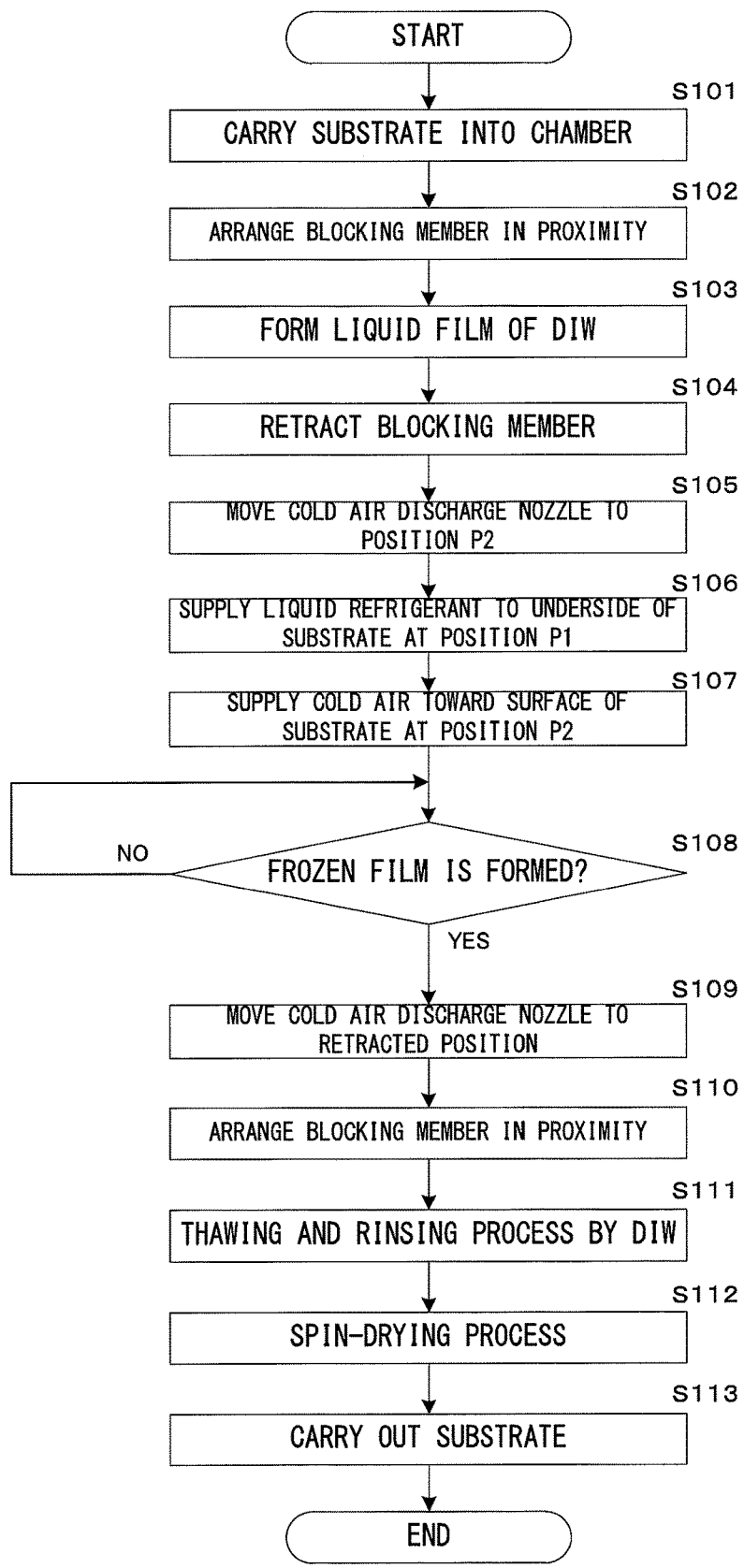
FIG. 5 is a flow chart showing a cleaning process operation by the substrate processing apparatus shown in FIG. 1.
Figure 6:
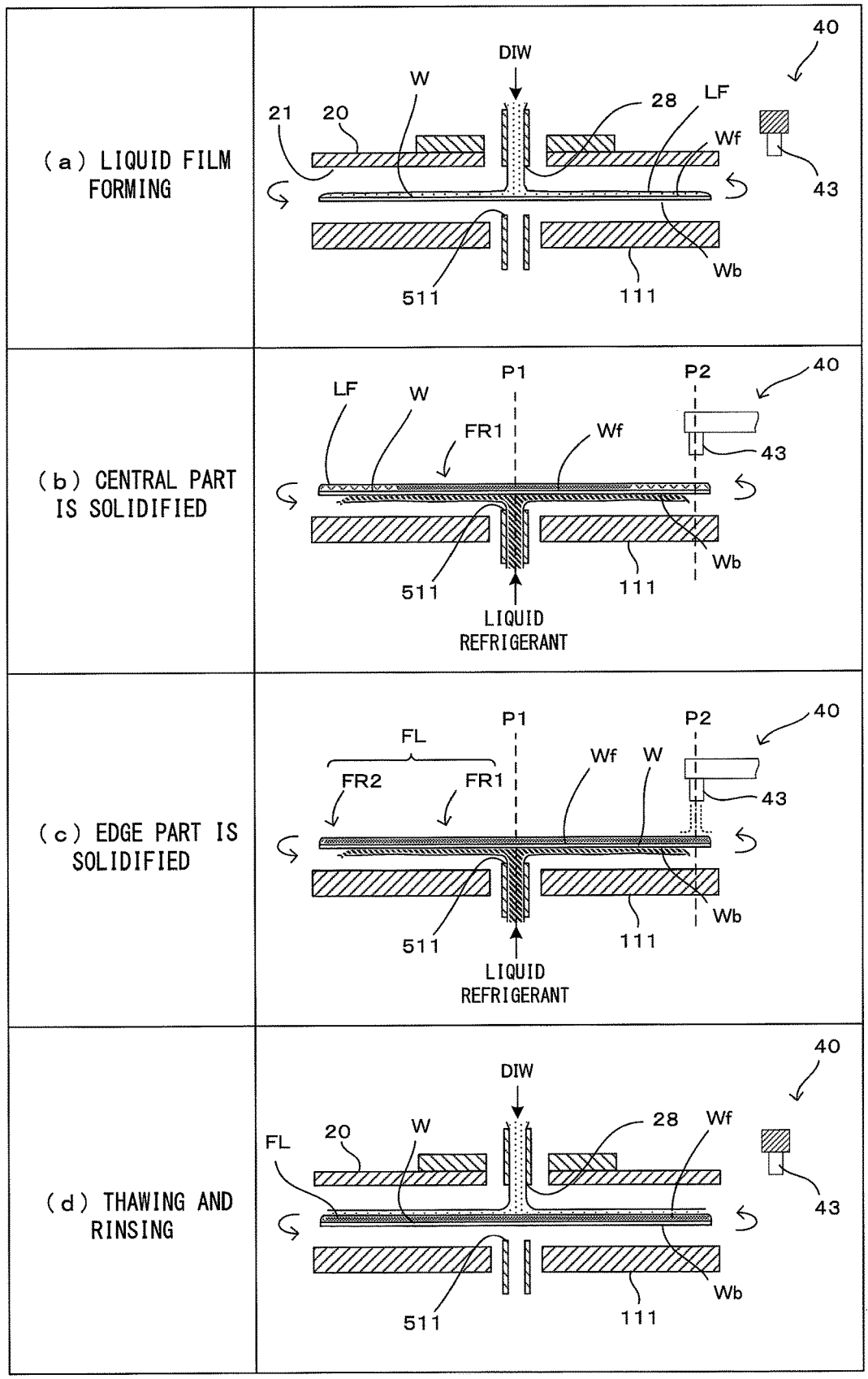
FIG. 6 is a diagram schematically showing the cleaning process operation.

FIG. 5 is a flow chart showing a cleaning process operation by the substrate processing apparatus shown in FIG. 1, and FIG. 6 is a diagram schematically showing the cleaning process operation. In the substrate processing apparatus 1 according to the embodiment, when an unprocessed substrate W is carried into the apparatus, the control unit 90 controls each component of the apparatus to perform a series of cleaning processes to the substrate W. Here, if the substrate W is such that a fine pattern is formed on a front surface Wf thereof, the substrate W is carried into the processing chamber with the front surface Wf of the substrate W faced up, and is held on the spin chuck 11 (Step S101). Note that, at this time, the blocking member 20 is at the separated position to prevent interference with the substrate W.

When the unprocessed substrate W is held on the spin chuck 11, the blocking member 20 is lowered to the facing position and arranged in proximity to the front surface Wf of the substrate W (Step S102). In this way, the front surface Wf of the substrate W is covered while being proximate to the substrate facing surface 21 of the blocking member 20 and blocked from atmosphere around the substrate W. Then, the control unit 90 drives the chuck rotating mechanism 113 to rotate the spin chuck 11 and supplies the DIW from the DIW supply unit 70.

At this time, as shown in field (a) of FIG. 6, a centrifugal force associated with the rotation of the substrate W acts on the DIW supplied to the front surface Wf of the substrate W, the DIW uniformly spreads radially outwardly of the substrate W and part thereof is spun off to the outside of the substrate. In this way, a thickness of the liquid film is uniformly controlled over the entire front surface Wf of the substrate W and a liquid film LF of the DIW having a predetermined thickness is formed on the entire front surface Wf of the substrate W (Step S103). A rotational frequency of the substrate W at this time may be determined such that part of the DIW is properly spun off and can be set, for example, at 150 rpm. Note that it is not an essential requirement to spin off part of the DIW supplied to the front surface Wf of the substrate W as described above in forming the liquid film. For example, the liquid film may be formed on the front surface Wf of the substrate W without spinning off the liquid from the substrate W with the rotation of the substrate W stopped or with the substrate W rotated at a relatively low speed.

When the liquid film formation is finished, the control unit 90 stops the supply of the DIW from the DIW supply unit 70 and retracts the blocking member 20 to the separated position (Step S104). Thereafter, the cold air discharge nozzle 43 is moved from the retracted position (solid-line position of FIG. 2) to the position P2 (Step S105). In this way, solidification preparation of the liquid film LF by the peripheral edge solidifier 40 is completed.

In next Step S106, as shown in field (b) of FIG. 6, the control unit 90 supplies the liquid refrigerant from the constant temperature bath body 521 to the position P1, which is the central part of the back surface Wb of the substrate W, by the liquid refrigerant supplier 53 (Step S106). A centrifugal force acts on the liquid refrigerant supplied in this way to be held in contact with the back surface Wb of the substrate W and the liquid refrigerant flows to spread in a radial direction of the substrate W. The causes the central part of the substrate W to be directly cooled by the liquid refrigerant in contact with the back surface Wb, and a central part of the liquid film LF formed on the front surface Wf of the substrate W is solidified in a relatively short time to form a solidified part FR1. Note that, in the embodiment, the rotational frequency of the substrate W at this time is so set that the liquid refrigerant does not flow around to the peripheral edge part of the front surface Wf of the substrate W similarly to the invention described in JP2008-28008A. More specifically, the control unit 90 adjusts the rotational frequency of the substrate W such that the above liquid refrigerant spreads in the radial direction and is separated downward from the back surface Wb of the substrate W before reaching the position P2 by controlling the drive of the chuck rotating mechanism 113. This prevents the liquid refrigerant from flowing around toward the front surface Wf of the substrate W and reliably prevents the contamination of the front surface Wf of the substrate W by the liquid refrigerant.

Further, at a timing slightly delayed from the start of solidification of the liquid film LF by the liquid refrigerant, the control unit 90 supplies the compressed gas to the vortex tube 42 by the cold air generating pressure adjuster 83 and supplies cold air (dotted line in FIG. 6) from the cold air discharge nozzle 43 toward the peripheral edge part of the front surface Wf of the substrate W as shown in field (c) of FIG. 6 (Step S107). In this way, the liquid refrigerant is directly supplied to the peripheral edge part of the liquid film LF, and the peripheral edge part of the liquid film LF is solidified in a relatively short time to form a solidified part FR2. As just described, in the embodiment, the entire liquid film is solidified to form a frozen film FL (=FR1+FR2) by solidifying the central part and the peripheral edge part of the liquid film LF in parallel while rotating the substrate W.

When the frozen film FL is formed ("YES" in Step S108), the control unit 90 returns the cold air discharge nozzle 43 from the position P2 to the retracted position (solid-line position of FIG. 2) by the nozzle rotating mechanism 44 (Step S109) after controlling the liquid refrigerant supplier 53 and the cold air generating pressure adjuster 83 to stop the supply of the liquid refrigerant and the cold air. Subsequent to that, the control unit 90 arranges the blocking member 20 in proximity to the front surface Wf of the substrate W by the blocking member elevating mechanism 25 (Step S110).

Subsequently, the control unit 90 starts the supply of the DIW from the DIW supply unit 70. The causes the DIW to be discharged from the nozzle 28 as shown in field (d) of FIG. 6 to perform a thawing process and a rinsing process for the frozen film FL (Step S111). Here, the DIW may be supplied also to the back surface Wb of the substrate W to simultaneously rinse the underside. When the both processes are completed, the control unit 90 stops the supply of the DIW from the DIW supply unit 70 and spin-dries the substrate W while supplying the drying gas (Step S112). Here, the drying gas may be simultaneously supplied to the back surface Wb of the substrate W. When the spin-drying process is finished in this way, the processes for one substrate are completed by carrying out the processed substrate W (Step S113).

As described above, a first solidifying step (Step S106) is of solidifying the central part of the liquid film LF by supplying the liquid refrigerant to the back surface Wb of the substrate W at the same position P1 as a center of rotation (axis of rotation AX1) of the substrate W. A second solidifying step (Step 107) is of solidifying the peripheral edge part of the liquid film LF by supplying the cold air toward the front surface Wf of the substrate W at the position P2 distant from the position P1 in the radial direction of the substrate W. According to the embodiment, the first solidifying step and the second solidifying step are performed in parallel while performing a rotating step of rotating the substrate W. Thus, the liquid film LF can be efficiently solidified in a short time to form the frozen film (solidified body) FL.

Further, in the embodiment, when the liquid refrigerant is supplied, the substrate W is rotated at a proper rotational frequency, i.e. at such a rotational frequency that the liquid refrigerant supplied to the back surface Wb of the rotating substrate W spreads in the radial direction, but is separated downward from the back surface Wb of the substrate W before reaching the position P2. Thus, the liquid refrigerant does not contact the front surface Wf of the substrate W and the contamination of the front surface Wf by particles adhering to the back surface Wb of the substrate W by the liquid refrigerant flowing around to the front surface Wf can be reliably prevented. Further, it takes time to solidify up to the peripheral edge part of the liquid film LF only by the supply of the liquid refrigerant to the back surface Wb of the substrate W while the substrate W is rotated at such a rotational frequency. However, in the embodiment, the entire liquid film LF can be solidified in a short time to form the frozen film (solidified body) FL as described above without contaminating the front surface Wf of the substrate W by performing the solidification of the peripheral edge part in parallel using the cold air.

Further, in the above embodiment, the liquid refrigerant generated using the cooling mechanism 522, which is actuated by controlling energization, as a "third cooling mechanism" of the invention, and the cold air generated utilizing the vortex effect are used as refrigerants for solidifying the liquid film LF. Thus, the invention is advantageous in terms of cost and apparatus size as compared to a conventional technique for generating a liquid film using liquefied nitrogen as described, for example, in JP2008-28008A. Specifically, in the conventional technique, a special piping structure and measures against dew condensation are necessary to handle liquefied nitrogen, thereby causing problems of increased cost and apparatus enlargement. On the other hand, in the above embodiment, liquefied nitrogen needs not be used and the above problems are absent.

Figure 7:
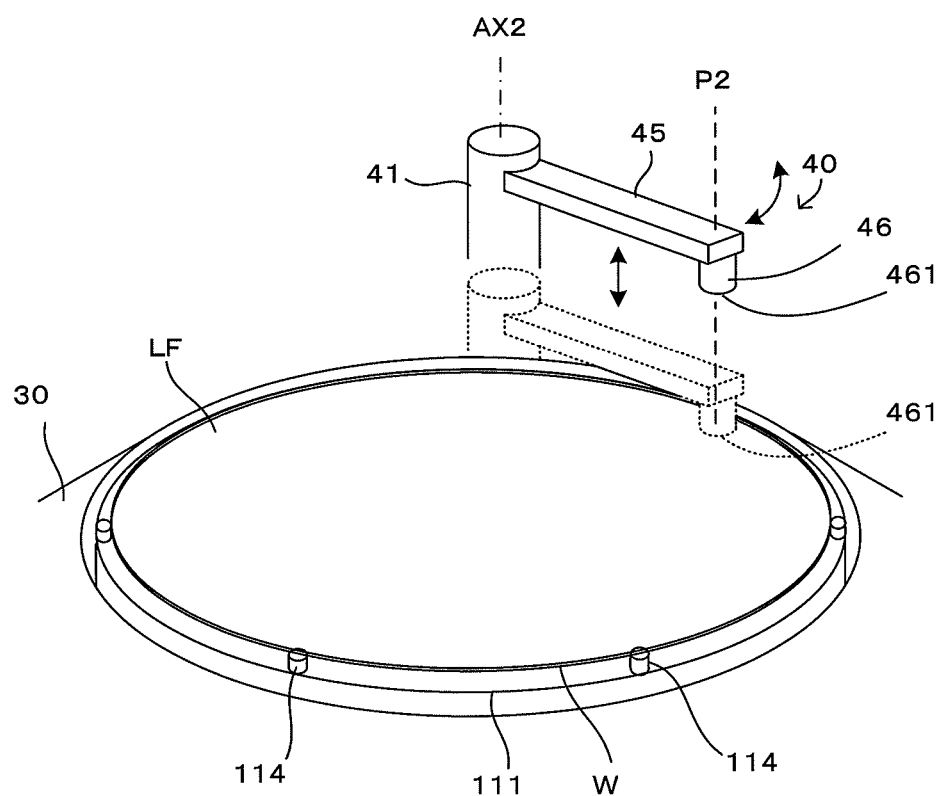
FIG. 7 is a diagram showing a partial configuration of a second embodiment of the substrate processing apparatus according to the invention.
Figure 8:
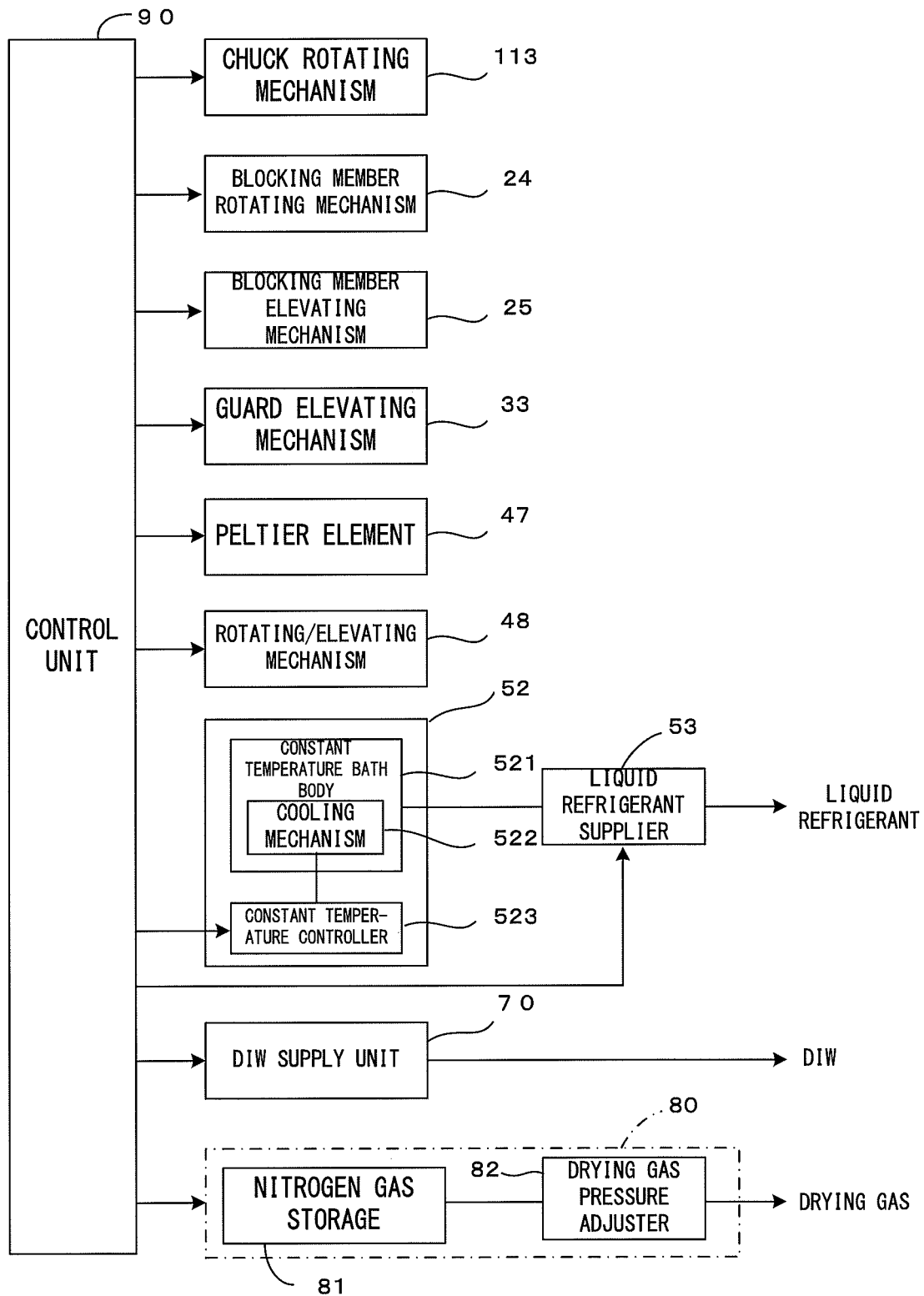
FIG. 8 is a block diagram showing a center solidifier, a peripheral edge solidifier and a control configuration of the substrate processing apparatus shown in FIG. 7.
Figure 9:
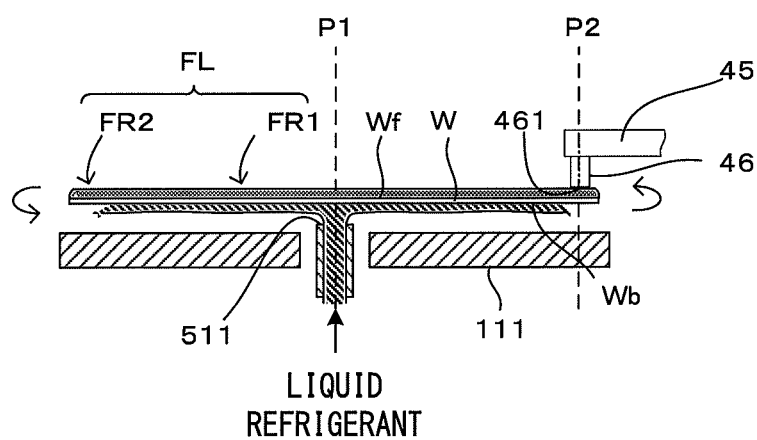
FIG. 9 is a diagram showing a part of a cleaning process operation by the substrate processing apparatus shown in FIG. 7.

FIG. 7 is a diagram showing a partial configuration of a second embodiment of the substrate processing apparatus according to the invention. FIG. 8 is a block diagram showing a center solidifier, a peripheral edge solidifier and a control configuration of the substrate processing apparatus shown in FIG. 7. FIG. 9 is a diagram showing a part of a cleaning process operation by the substrate processing apparatus shown in FIG. 7. The second embodiment largely differs from the first embodiment in the configuration of the peripheral edge solidifier 40 while the other configuration is basically the same as in the first embodiment. Thus, the following description is centered on points of difference and the same components are denoted by the same reference signs and not described.

As shown in FIG. 7, a peripheral edge solidifier 40 employed in the second embodiment includes a rotary shaft 41 configured to be rotatable about a vertical axis AX2, an arm 45 extending in a horizontal direction from the rotary shaft 41, a contact member 46 mounted on the tip of the arm 45 while being faced down, a Peltier element 47 (FIG. 8) mounted on the contact member 46 and a rotating/elevating mechanism 48 (FIG. 8) for rotating the arm 45. In the embodiment, the rotating/elevating mechanism 48 drives and rotates the rotary shaft 41 in response to a rotation command from a control unit 90, whereby the arm 45 swings about the vertical axis AX2, which causes the contact member 46 to reciprocally move between a retracted position outside a splash guard 30 and a position where the contact member 46 faces a peripheral edge part of a substrate W (corresponding to the "second position" of the invention) P2 (FIG. 7). Further, the rotating/elevating mechanism 48 drives and raises and lowers the rotary shaft 41 in response to an elevation command from the control unit 90, whereby a lower surface (processing surface) 461 of the contact member 46 moves upward and downward between a liquid contact position (positon shown in dotted line of FIG. 7) where the lower surface 461 is in contact with a liquid film LF located on a peripheral edge part of the front surface Wf of the substrate W and a separated position (position shown in solid line of FIG. 7) separated upward from the liquid film LF.

The Peltier element 47 cools the lower surface (corresponding to an example of a "processing surface" of the invention) 461 of the contact member 46 to a temperature lower than a solidification point of DIW in response to a cooling command from the control unit 90. Thus, if the lower surface 461 of the contact member 46 cooled by the Peltier element 47 is brought into contact with the liquid film LF by the rotating/elevating mechanism 48, a part of the liquid film LF brought into contact with the contact member 46 and its surrounding part are solidified to form a solidified part. Further, by rotating the substrate W with the lower surface 461 of the contact member 46 held in contact with the liquid film LF, the solidified part spreads in a rotating direction. However, the solidified part adheres not only to the front surface Wf of the substrate W, but also to the lower surface 461 of the contact member 46. Thus, to form a frozen film FL over the entire front surface Wf of the substrate W, the contact member 46 needs to be removed from the solidified part, following the above solidifying operation. To that end, adhesion between the lower surface 461 of the contact member 46 and the solidified part (also called "ice adhesion") is desirably smaller than adhesion (ice adhesion) between the front surface Wf of the substrate W and the solidified part.

In the second embodiment thus configured, the peripheral edge part of the liquid film LF is solidified using the contact member 46 (solid refrigerant) instead of cold air. Specifically, as shown in FIG. 9, the control unit 90 forms the frozen film FL (=FR1+FR2) by the supply of the liquid refrigerant and the contact of the contact member 46 with the liquid while the substrate W is rotated. Specifically, a solidified part FR1 is formed by solidifying a central part of the liquid film LF by supplying the liquid refrigerant to a central part of an back surface Wb of the substrate W from a constant temperature bath body 521 by a liquid refrigerant supplier 53, and a solidified part FR2 is formed by solidifying the liquid film LF by bringing the lower surface 461 of the contact member 46 cooled to the temperature lower than the solidification point of the DIW by the Peltier element 47 into contact with the liquid film LF at the position P2.

As described above, in the second embodiment, the frozen film (solidified body) FL is formed by solidifying the entire liquid film LF as in the first embodiment except for the above points of difference. Thus, functions and effects similar to those of the first embodiment are obtained. Further, since the liquid film LF is directly cooled by bringing the lower surface 461 of the contact member 46 having a temperature lower than the solidification point of the DIW into contact with the liquid film LF, the liquid film LF located on the peripheral edge part of the front surface Wf of the substrate W can be more efficiently solidified than in the first embodiment using the gas refrigerant.

In the first and second embodiments described above, the DIW corresponds to an example of a "liquid to be solidified" of the invention. Further, the chuck rotating mechanism 113 corresponds to an example of a "rotator" of the invention. Further, the position P2 is more distant in the radial direction from the center of rotation (axis of rotation AX1) of the substrate W than the position P1, and the positions P1, P2 respectively correspond to a "first position" and a "second position" of the invention. Further, the center solidifier 50 and the peripheral edge solidifier 40 respectively correspond to examples of a "first solidifier" and a "second solidifier" of the invention. Further, in the first embodiment, the liquid film LF is solidified at the position P2 by the vortex tube 42 for generating cold air and the cold air discharge nozzle 43, and an example of a "first cooling mechanism" of the invention is configured by the vortex tube 42 and the cold air discharge nozzle 43. On the other hand, in the second embodiment, an example of a "second cooling mechanism" of the invention is configured by the contact member 46 and the Peltier element 47.

Note that the invention is not limited to the above embodiments and various changes other than those described above can be made without departing from the gist of the invention. For example, although:

a step (A1) of starting the solidification of the central part of the liquid film LF by the liquid refrigerant;

a step (A2) of forming the solidified part FR1;

a step (B1) of starting the solidification of the peripheral edge part of the liquid film LF by cold air or the contact of the contact member 46 with the liquid; and a step (B2) of forming the solidified part FR2, are performed in this order in the above embodiments, the order of these may be changed by performing some of these in an overlapping manner or may be partially reversed. For example, the step (B1) may be performed during the step (A2), i.e. after the solidified part FR1 is partially formed. Further, the steps (A1) and (B1) may be simultaneously performed. Further, these steps may be performed in an order of step (B1)→step (B2)→step (A1)→step (A2). Further, although the supply of the liquid refrigerant and the supply of the cold air are simultaneously finished in the above embodiments, these may be finished at arbitrary timings.

Further, although the cold air is supplied to the front surface Wf of the substrate W vertically from above in the first embodiment, a cold air supplying direction is not limited to this as long as cold air is supplied to the liquid film LF located at the position P2. For example, the peripheral edge part of the liquid film LF may be solidified by supplying cold air to the back surface Wb of the substrate W at the position P2. Further, cold air may be supplied obliquely from above or below. Further, although the position P1 is matched with the axis of rotation AX1 in the above embodiments, a position deviated from the axis of rotation AX1 in the radial direction of the substrate W may be set as the position P1.

Further, although the cold air is supplied in the first embodiment and the lower surface 461 of the contact member 46 is brought into contact with the liquid in the second embodiment to solidify the liquid film LF located on the peripheral edge part of the front surface Wf of the substrate W, these methods may be performed together. For example, the first cooling mechanism for supplying cold air to the back surface Wb of the substrate W at the position P2 may be further added to the second embodiment to solidify the liquid film LF located on the peripheral edge part of the front surface Wf of the substrate W.

Further, although the invention is applied to the substrate processing apparatus 1 with the blocking member 20 in the above embodiments, an application object of the invention is not limited to this and the invention can be applied also to substrate processing apparatuses using no blocking member.

Further, although the DIW is supplied as the liquid to be solidified to the substrate W in the above embodiments, the liquid to be solidified is not limited to the DIW and liquids such as pure water, ultrapure water, hydrogen water, carbonated water, SC1 (ammonia-hydrogen peroxide mixture) or the like can also be used.

Further, although the DIW is supplied to the substrate W to thaw (melt) and remove the frozen film (solidified body) FL in each of the above embodiments, the thawing or melting liquid is not limited to the DIW and liquids such as pure water, ultrapure water, hydrogen water, carbonated water, SC1 or the like can also be used.

Further, although the liquid to be solidified and the thawing liquid (melting liquid) are the same DIW in each of the above embodiments, those liquids may be different liquids.

The invention can be applied to a solidification technique for solidifying a liquid to be solidified adhering to a surface of a substrate and substrate processing techniques in general for cleaning a surface of a substrate using the solidification technique.

What is claimed is:

1. A substrate processing apparatus, comprising:
a substrate holder that holds a substrate in a horizontal posture with a front surface having a liquid film of a liquid to be solidified adhering thereto faced up;
a first solidifier that solidifies a central part of the liquid film by supplying a liquid refrigerant having a temperature lower than a solidification point of the liquid to be solidified to a back surface of the substrate at a central first position on the substrate;
a rotator that rotates the substrate held by the substrate holder about a vertical axis such that the liquid refrigerant supplied to the back surface of the substrate from the first solidifier spreads in a radial direction and is separated from the back surface of the substrate before reaching a second position on the substrate that is more distant from a center of rotation of the substrate in the radial direction than the first position;
a second solidifier that solidifies a peripheral edge part of the liquid film by a cooling mechanism that cools the liquid to be solidified by bringing a processing surface having a temperature lower than the solidification point of the liquid to be solidified into contact with the peripheral edge part of the liquid film at the second position; and
a rotating/elevating mechanism that moves the processing surface of the cooling mechanism between a liquid contact position where the processing surface is in contact with the liquid film and a separated position separated from the liquid film, wherein
the entire liquid film is solidified by the first and second solidifiers in parallel with the rotation of the substrate by the rotator.

2. The substrate processing apparatus according to claim 1, wherein
the cooling mechanism includes a contact member having the processing surface and a Peltier element for cooling the processing surface to a temperature lower than the solidification point of the liquid to be solidified.

3. The substrate processing apparatus according to claim 1, wherein
the first solidifier includes a constant temperature bath for keeping a liquid stored in a constant temperature bath body at a temperature lower than the solidification point of the liquid to be solidified by controlling energization to a third cooling mechanism provided in the constant temperature bath body and a liquid refrigerant supply pipe for supplying the liquid stored in the constant temperature bath body as the liquid refrigerant to the back surface of the substrate.

4. A substrate processing method, comprising:
providing a substrate holder for holding a substrate in a horizontal posture, and a rotator for rotating the substrate held by the substrate holder about a vertical axis;
rotating the substrate on the substrate holder about the vertical axis in a horizontal posture with a front surface having a liquid to be solidified adhering thereto faced up;
providing a first solidifier for solidifying a central part of the liquid film by supplying a liquid refrigerant having a temperature lower than a solidification point of the liquid to be solidified to a back surface of the substrate at a central first position on the substrate;
a first solidifying step of solidifying the liquid to be solidified by supplying the liquid refrigerant having a temperature lower than a solidification point of the liquid to be solidified to the back surface of the substrate at said first position, and rotating the substrate on said rotator such that the liquid refrigerant supplied to the back surface of the substrate from the first solidifier spreads in a radial direction and is separated from the back surface of the substrate before reaching a second position on the substrate that is more distant from a center of rotation of the substrate in the radial direction than the first position; and
providing a second solidifier that solidifies a peripheral edge part of the liquid film by a cooling mechanism that cools the liquid to be solidified by bringing a processing surface having a temperature lower than the solidification point of the liquid to be solidified into contact with the peripheral edge part of the liquid film at the second position, by a rotating/elevating mechanism that moves the processing surface of the cooling mechanism between a liquid contact position where the processing surface is in contact with the liquid film and a separated position separated from the liquid film; and
a second solidifying step of solidifying the liquid to be solidified by performing at least one of a supplying step and a bringing step, the supplying step being of supplying a gas refrigerant having a temperature lower than the solidification point of the liquid to be solidified toward the substrate at said second position more distant from a center of rotation of the substrate in a radial direction than the first position, and the bringing step being of bringing a contact member having said processing surface having a temperature lower than the solidification point of the liquid to be solidified into contact with the liquid to be solidified at the second position, wherein
the entire liquid film is solidified by the first and second solidifiers in parallel with the rotation of the substrate by the rotator; and
the first and second solidifying steps are performed during the rotating step.

* * * * *